United States Patent
Sato et al.

(10) Patent No.: US 6,885,005 B2
(45) Date of Patent: *Apr. 26, 2005

(54) RADIATION DETECTOR

(75) Inventors: Kenji Sato, Otsu (JP); Satoshi Tokuda, Kusatsu (JP)

(73) Assignee: Shimadzu Corporation, Kyoto (JP)

( * ) Notice: Subject to any disclaimer, the term of this patent is extended or adjusted under 35 U.S.C. 154(b) by 222 days.

This patent is subject to a terminal disclaimer.

(21) Appl. No.: 10/272,678

(22) Filed: Oct. 17, 2002

(65) Prior Publication Data

US 2003/0127598 A1 Jul. 10, 2003

(30) Foreign Application Priority Data

Oct. 22, 2001 (JP) ........................................ 2001-323613

(51) Int. Cl.⁷ ............................................... G01T 1/24
(52) U.S. Cl. ................................................ 250/370.01
(58) Field of Search ........................ 250/370.01, 370.08

(56) References Cited

U.S. PATENT DOCUMENTS 6,399,950 B1 * 6/2002 Kimura et al. ......... 250/370.09
6,635,860 B1 * 10/2003 Sato et al. ............... 250/214.1

FOREIGN PATENT DOCUMENTS

JP 63-243745 A * 10/1988 .......... G01N/27/30

* cited by examiner

Primary Examiner—David Porta
Assistant Examiner—Marcus Taningco
(74) Attorney, Agent, or Firm—Rankin, Hill, Porter & Clark LLP

(57) ABSTRACT

A high withstand voltage insulating substance is formed between a radiation sensitive type amorphous semiconductor thick film suitable for forming a large area and an end edge portion of a voltage application electrode. As a result, concentration of an electric field on the end edge portion of the voltage application electrode is eliminated and a prestage phenomenon of penetration discharge or discharge breakdown is not caused.

5 Claims, 11 Drawing Sheets

INITIAL STATE OF
VOLTAGE APPLICATION

VOLTAGE APPLICATION ELECTRODE 82

END EDGE 82a

18 HOURS HAS PASSED
AFTER VOLTAGE APPLICATION

RADIATION DETECTOR

BACKGROUND OF THE INVENTION

1. Field of the Invention

The present invention relates to a radiation detector of a direct conversion type used in the medical field, the industrial field, the atomic field and the like, particularly relates to a technique for improving a withstand voltage property of a semiconductor film of a radiation sensitive type.

2. Description of the Related Art

According to detectors for detecting radiation (for example, X-ray), there are an indirect conversion type detector and a direct conversion type detector. The indirect conversion type detector is adapted to convert radiation (for example, X-ray) firstly into light and thereafter convert converted light into an electric signal by photoelectric conversion. The direct conversion type detector is adapted to directly convert incident radiation into an electric signal by a semiconductor film of a radiation sensitive type.

The latter direct conversion type detector is constructed by a constitution in which radiation is detected by applying predetermined bias voltage to a voltage application electrode formed at a front surface of the radiation sensitive type semiconductor film, collecting carriers generated in accordance with irradiation of radiation by a carrier collection electrode formed at a back surface of the semiconductor film and outputting the carriers as a radiation detection signal.

Further, among the related art radiation detector of the direct conversion type, when a semiconductor thick film such as that of amorphous selenium is used as a semiconductor film, the amorphous semiconductor can be formed as a thick and large film simply by a method of vacuum evaporation or the like. Therefore, the amorphous semiconductor is suitable for constituting a two-dimensional array type radiation detector which needs a large area thick film.

As shown in FIG. 11, the related art two-dimensional array type radiation detector is constituted by an insulating substrate 86, a semiconductor thick film 81, and a voltage application electrode 82. The insulating substrate 86 is formed with a plurality of capacitors Ca for storing charge and switching elements (for example, thin film transistors) 88 in a normally OFF state in an alignment of a vertical/horizontal two-dimensional matrix. The semiconductor thick film 81 is electrically connected respectively to the plurality of charge storage capacitors Ca, and formed on the insulating substrate 86 via a plurality of carrier collection electrodes 87. In semiconductor thick film 81, charge transfer media (carriers) are generated by incidence of radiation. The voltage application electrode 82 is formed on a surface of the amorphous semiconductor thick film 81. Further, each of the carrier collection electrodes 87 is provided with one of the charge storage capacitors Ca and one of the charge reading switching elements 88. Each of sets of carrier collection electrodes 87, the charge storage capacitor Ca and the charge reading switching element 88 form a detecting element DU serving as a radiation detection unit.

Here, when radiation is irradiated to the voltage application electrode 82 in a state of being applied with bias voltage, charge is formed at the amorphous semiconductor thick film 81 and stores at the charge storage capacitor Ca and the stored charge is read as a radiation detection signal by bringing the switching element 88 into an ON state.

When the radiation detector of the two-dimensional array constitution of FIG. 11 is used for, for example, detecting a X-ray fluoroscopic image of an x-ray fluoroscopic imaging apparatus, an X-ray fluoroscopic image is provided based on the radiation detection signal outputted from the radiation detector.

However, according to the related art radiation detector, there is a problem that an electric field is concentrated on an end edge portion of the voltage application electrode 82 formed at the surface of the amorphous semiconductor thick film 81 and dielectric breakdown is liable to cause at the end edge portion. There are two modes of dielectric breakdown caused at the end edge portion. One of the modes is a mode of creeping discharge in which dielectric breakdown is caused at a path to portions 810a, 811a, and 812a, which are exposed on the insulating substrate 86, of a read line 810, a gate line 811 and a ground line 812 from an end edge 82a of the voltage application electrode 82 along a surface of an end edge 81a of the amorphous semiconductor thick film 81.

Other of the breakdown modes is a mode of penetration discharge in which dielectric breakdown is caused at a path to a carrier collection electrode 87a, which is installed right below the end edge 82a of the voltage application electrode 82, from the end edge 82a of the voltage application electrode 82 by penetrating inside of the end edge 81a of the amorphous semiconductor thick film 81.

FIG. 12 is a view enlarging the end edge 82a of the voltage application electrode 82, which is overwritten with a potential distribution when voltage is applied. According thereto, the potential distribution at a vicinity of an end portion of the electrode (down to 10 µm from electrode surface) is calculated and field strength at the vicinity of the end portion of the upper electrode is predicted. As is apparent from the drawing, it is known that on the vicinity of the end portion of the electrode, a change in the potential is large and the electric field is concentrated. Further, when the high bias voltage is continued to be applied in the state in which the electric field is concentrated on the end edge 82a of the voltage application electrode 82, discharge is caused at the end edge portion of the voltage application electrode. When dark current is acquired under this state, there is provided a band-like or a block-like image as shown in FIG. 13B. Here, FIG. 13A shows an image provided from the detector in an initial state of voltage application and FIG. 13B shows an image provided from the detector at the time when 18 hours has passed after voltage application. In the drawings, gray upper portions are produced by dark current right below the electrode and FIG. 13B shows a prestage phenomenon of penetration discharge and the image is whitened due to current by discharge. Further, these noises spread also to other portion and the detector cannot operate in the normal operation. Further, when the high bias voltage is continued to apply to the voltage application electrode for a long period of time, a probability of causing discharge breakdown is rapidly increased.

SUMMARY OF THE INVENTION

The invention has been created in order to resolve the problem by concentration of an electric field on an end edge portion of an electrode. It is an object thereof to provide a radiation detector capable of preventing penetration discharge or creeping discharge by concentration of an electric field on an end edge portion of a voltage application electrode formed at a surface of a radiation sensitive type semiconductor film and capable of guaranteeing stable detecting operation for a long period of time.

To achieve the foregoing object, according to a first aspect of the present invention, there is provided a a radiation detector comprising:

an insulating substrate formed with a capacitor for storing charge and a switching element for reading the charge;

a carrier collection electrode formed on the insulating substrate and electrically connected to the charge storage capacitor;

a radiation sensitive type semiconductor thick film formed on the carrier collection electrode for generating charge transfer media by incidence of a radiation;

a voltage application electrode formed on a surface of the semiconductor thick film; and an insulating substance with a high withstand voltage property formed between the semiconductor thick film and an end edge portion of the voltage application electrode, wherein the charge is generated at the semiconductor thick film by irradiating the radiation, stored at the charge storage capacitor and read as a radiation detection signal via the switching element.

Further, in a second aspect of the present invention, according to the first aspect of the invention, the radiation detector preferably further comprising:

a high resistance film with a solvent resistance property and a carrier selective property formed at least between the semiconductor thick film and the high withstand voltage insulating substance.

Further, in a third aspect of the present invention, according to the first or second aspect of the invention, it is preferable that a plurality of the carrier collection electrodes are formed in a shape of a two-dimensional matrix, and one of the charge storage capacitors and one of the charge reading switching elements are provided at each of the carrier collection electrodes to thereby constitute a two-dimensional array.

Further, in a fourth aspect of the present invention, according to any one of the first through third aspect of the invention, it is preferable that the high withstand voltage insulating substance has a thickness with a gradient to be increased toward the end edge portion of the voltage application electrode.

Further, in a fifth aspect of the present invention, according to any one of the first through fourth aspect of the invention, it is preferable that the semiconductor thick film is an amorphous semiconductor thick film in the radiation detector.

Next, an explanation will be given of operation of the respective radiation detector according to the invention.

When radiation is detected by the radiation detector of the first aspect of the present invention, bias voltage is applied to the voltage application electrode formed on the surface side of the radiation sensitive type semiconductor thick film and radiation constituting an object of detection is made incident on the detector. Then, in correspondence with charge transfer media (carriers) generated at the semiconductor thick film by incidence of radiation, charge is stored at the charge storage capacitor electrically connected to the carrier collection electrode. Further, in accordance with a shift of the switching element for reading charge to an ON state, stored charge is read as a radiation detection signal via the switching element.

Further, in the case of the radiation detector of the first aspect of the present invention, the insulating substance with the high withstand voltage property is formed between the semiconductor thick film and the end edge portion of the voltage application electrode. Therefore, as is predicted also from a result of an electric field calculating simulation of FIG. 10, concentration of an electric field on the end edge portion of the voltage application electrode is prevented, a prestage phenomenon of penetration discharge or discharge breakdown is not caused and stable detecting operation is continued for a long period of time.

Further, in the case of the radiation detector of the second aspect of the present invention, the high resistance film, which is provided with a solvent resistance property and a carrier selective property, is formed at least between the semiconductor thick film and the insulating substance with the high withstand voltage property. Therefore, there is not caused a phenomenon in which the surface of the semiconductor thick film is denatured by a solvent component of the high withstand voltage insulating substance, creeping discharge is caused and withstand voltage is lowered. Further, when a carrier selective material suitable for use is pertinently selected, a deterioration in sensitivity, an increase in dark current or the like at a portion of forming the high resistance film is prevented.

In the case of the radiation detector of the third aspect of the present invention, there is constructed the two-dimensional array constitution in which the charge storage capacitors and the charge reading switching elements are respectively provided for respectives of the plurality of carrier collection electrodes which are formed in the shape of the two-dimensional matrix. Further, the radiation detection units are aligned in a shape of a matrix to form a two-dimensional array construction and radiation is locally detected for the respective radiation detection unit.

In the case of the radiation detector of the fourth aspect of the present invention, the withstand voltage insulating substance has the thickness with the gradient so that the insulating substance is formed to be infinitely thinned to the inner side and thickened to the outer side. Therefore, concentration of the electric field on the end edge portion of the voltage application electrode is further reduced and further stable detecting operation is guaranteed for a long period of time.

DETAILED DESCRIPTION OF THE INVENTION

Figure 1:
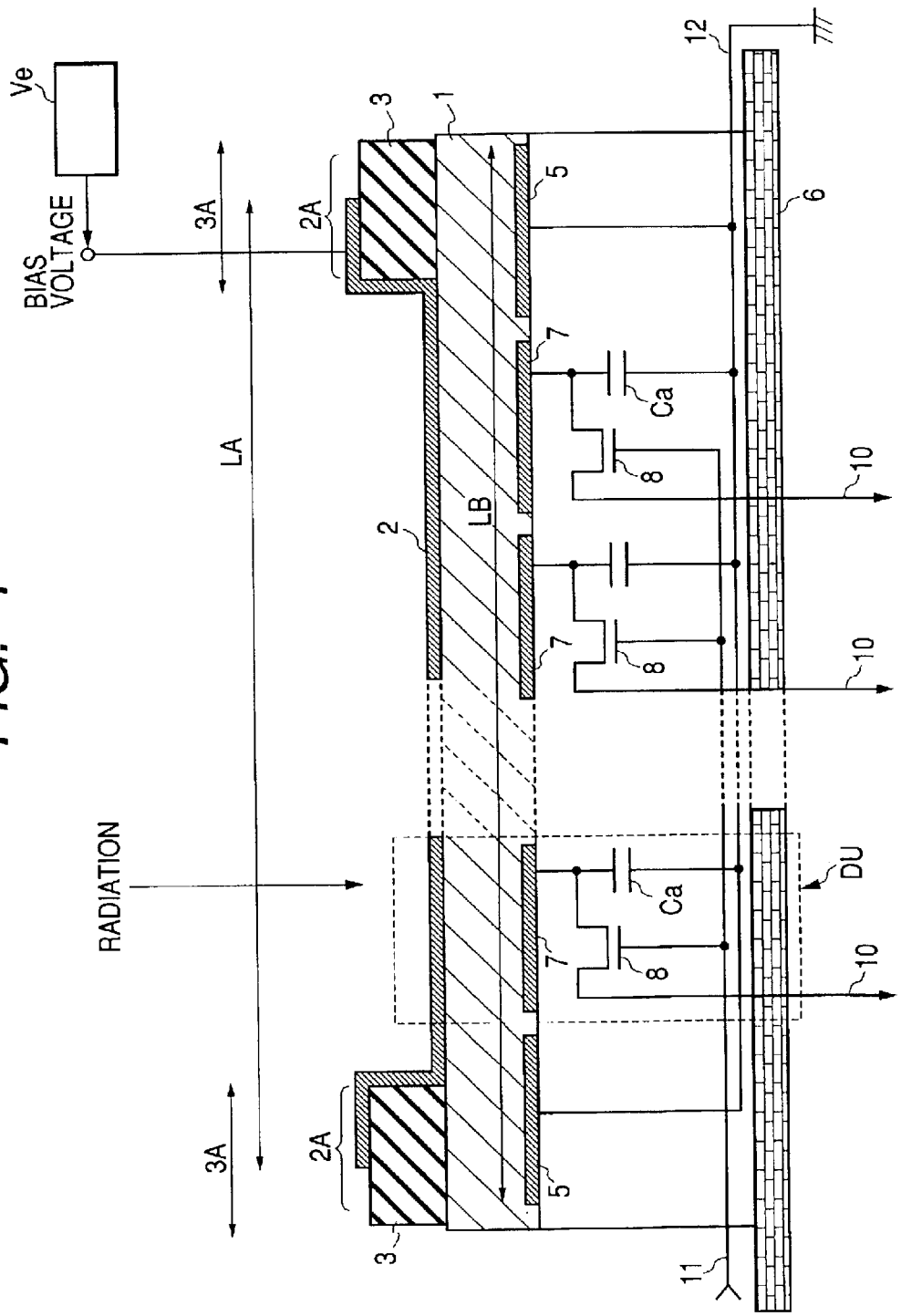
FIG. 1 is an outline sectional view showing a constitution of a radiation sensor portion according to a first embodiment of the invention.
Figure 2:
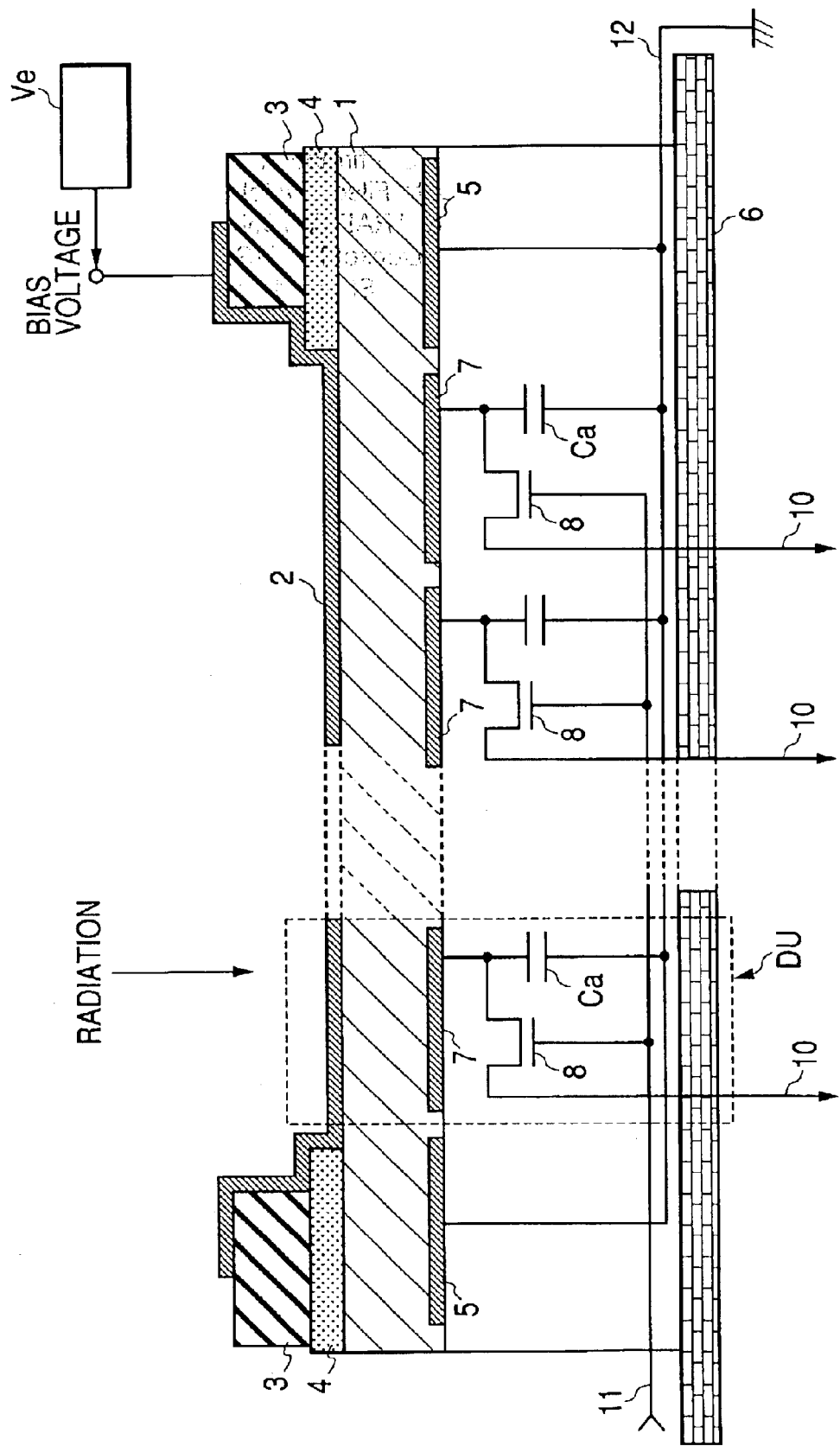
FIG. 2 is an outline sectional view showing a constitution of a radiation sensor portion which is a second embodiment of the invention.
Figure 3:
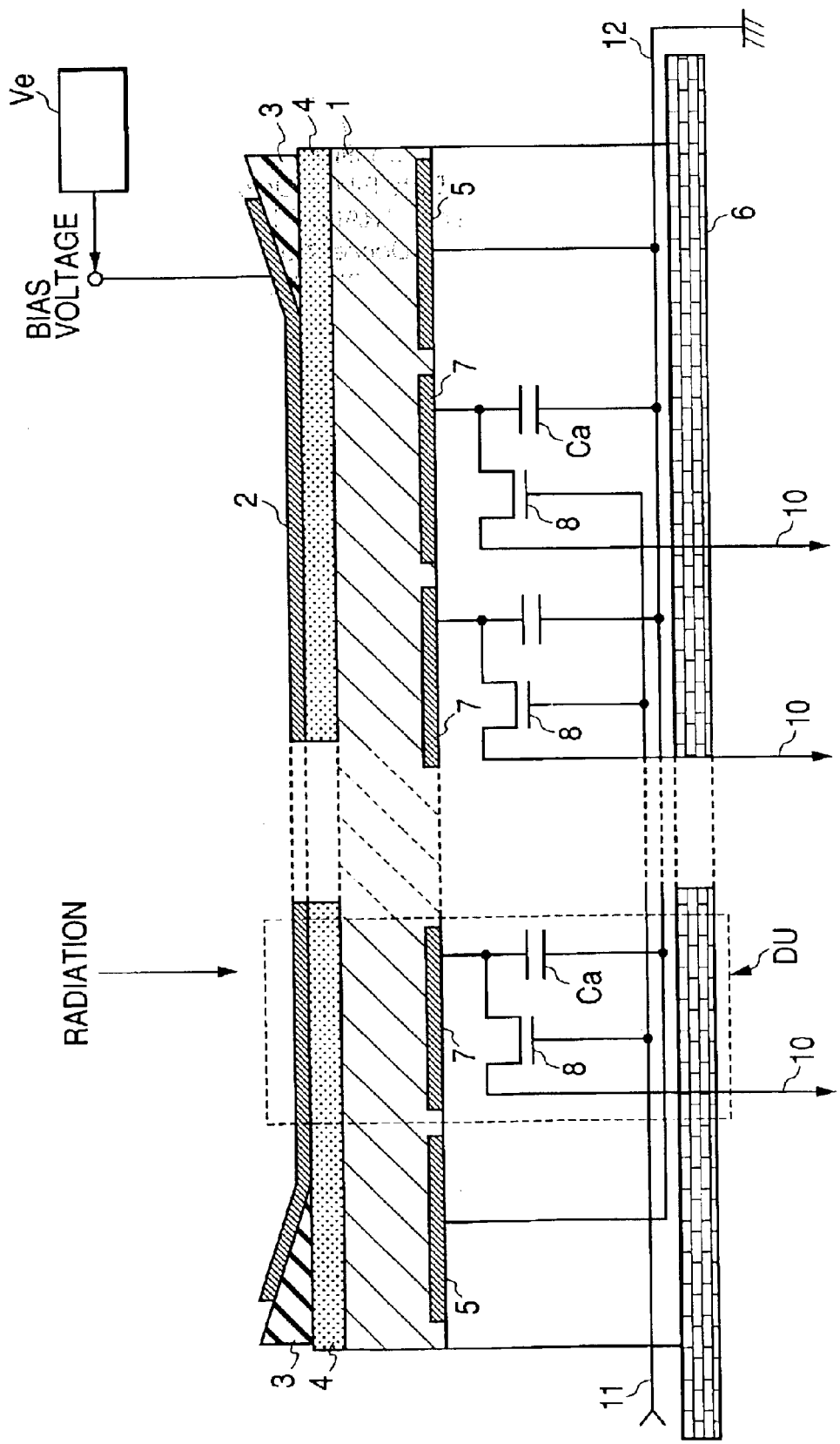
FIG. 3 is an outline sectional view showing a constitution of a radiation sensor portion which is a third embodiment of the invention.
Figure 4:
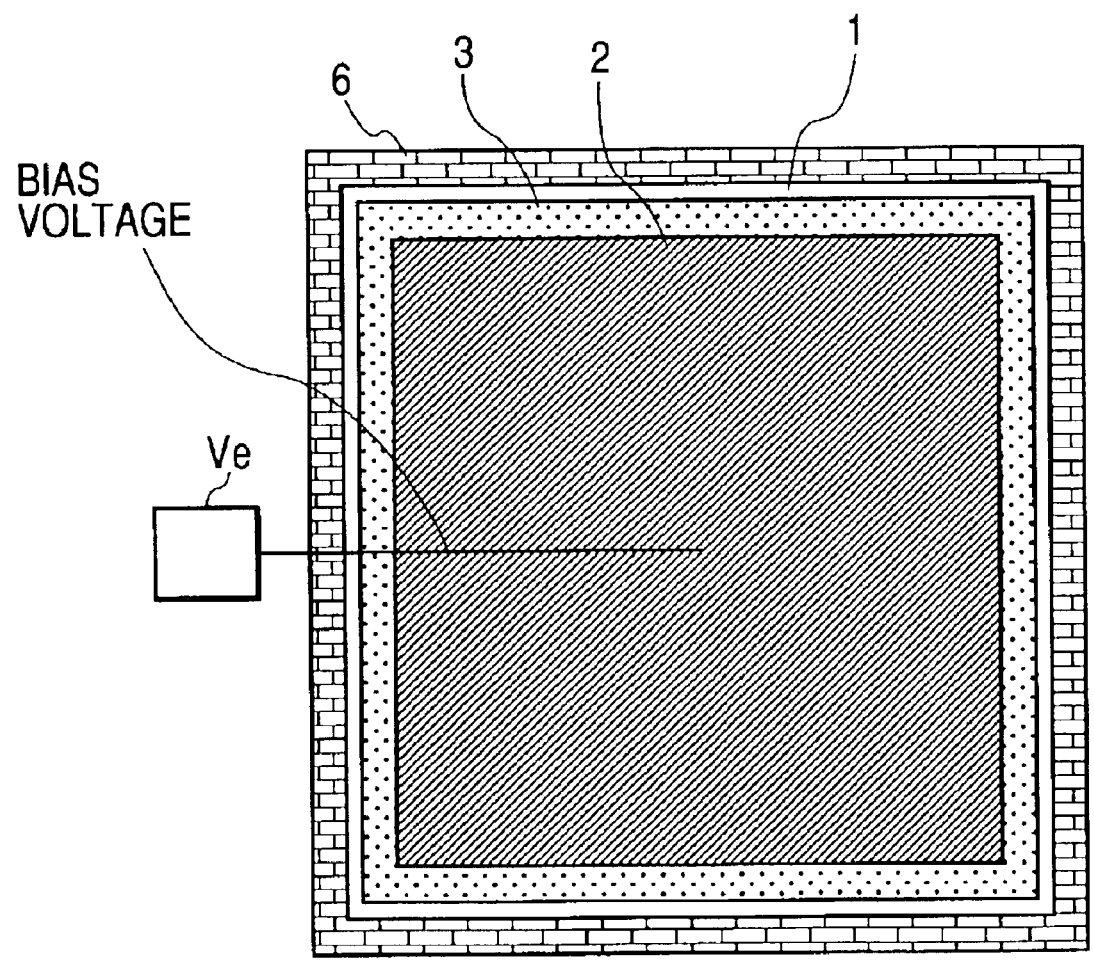
FIG. 4 is a plane view of the radiation sensor portion according to the embodiment of the invention.
Figure 5:
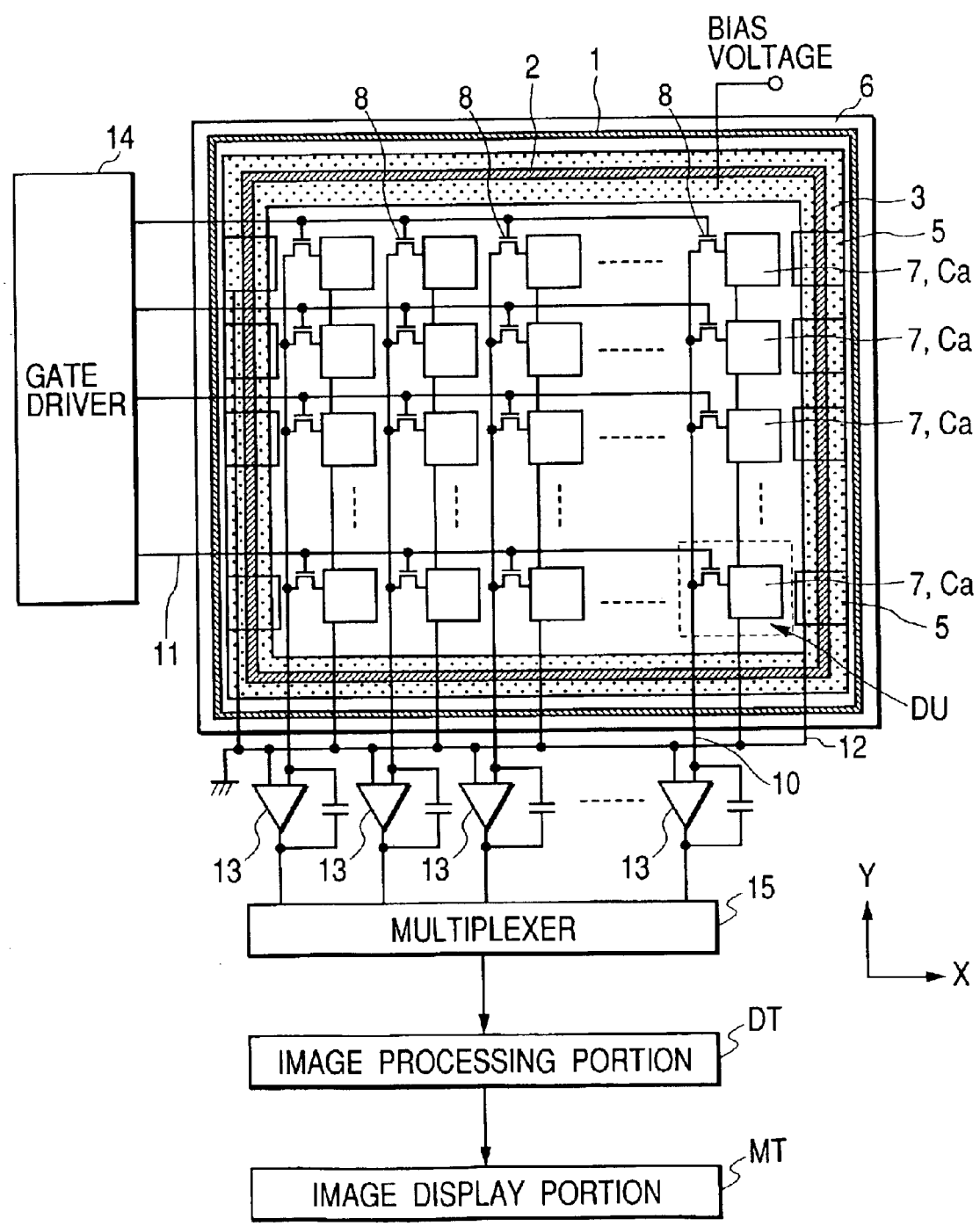
FIG. 5 is a block diagram showing a total constitution of the radiation detector according to the embodiment of the invention.
Figure 6:
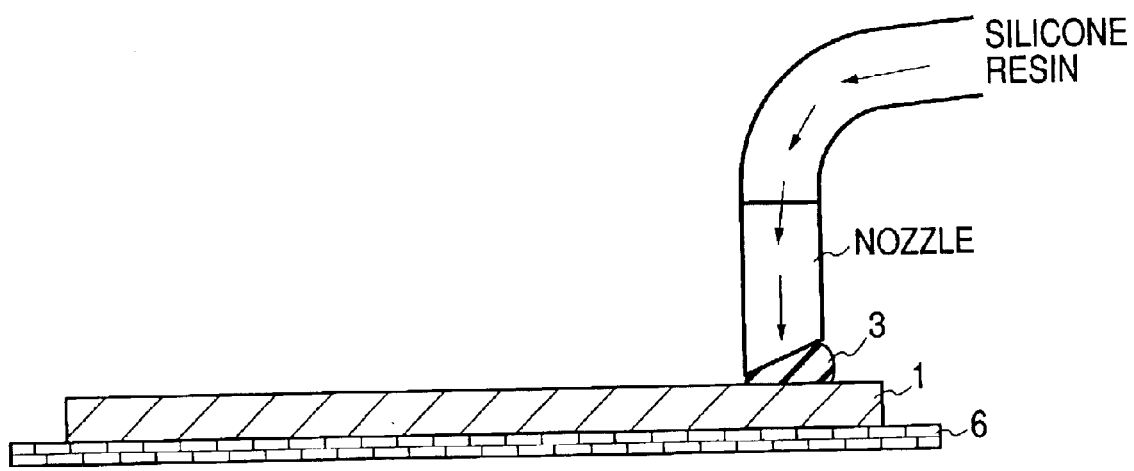
FIG. 6 is a view for explaining a method of forming a high withstand voltage insulating substance according to the invention.
Figure 7:
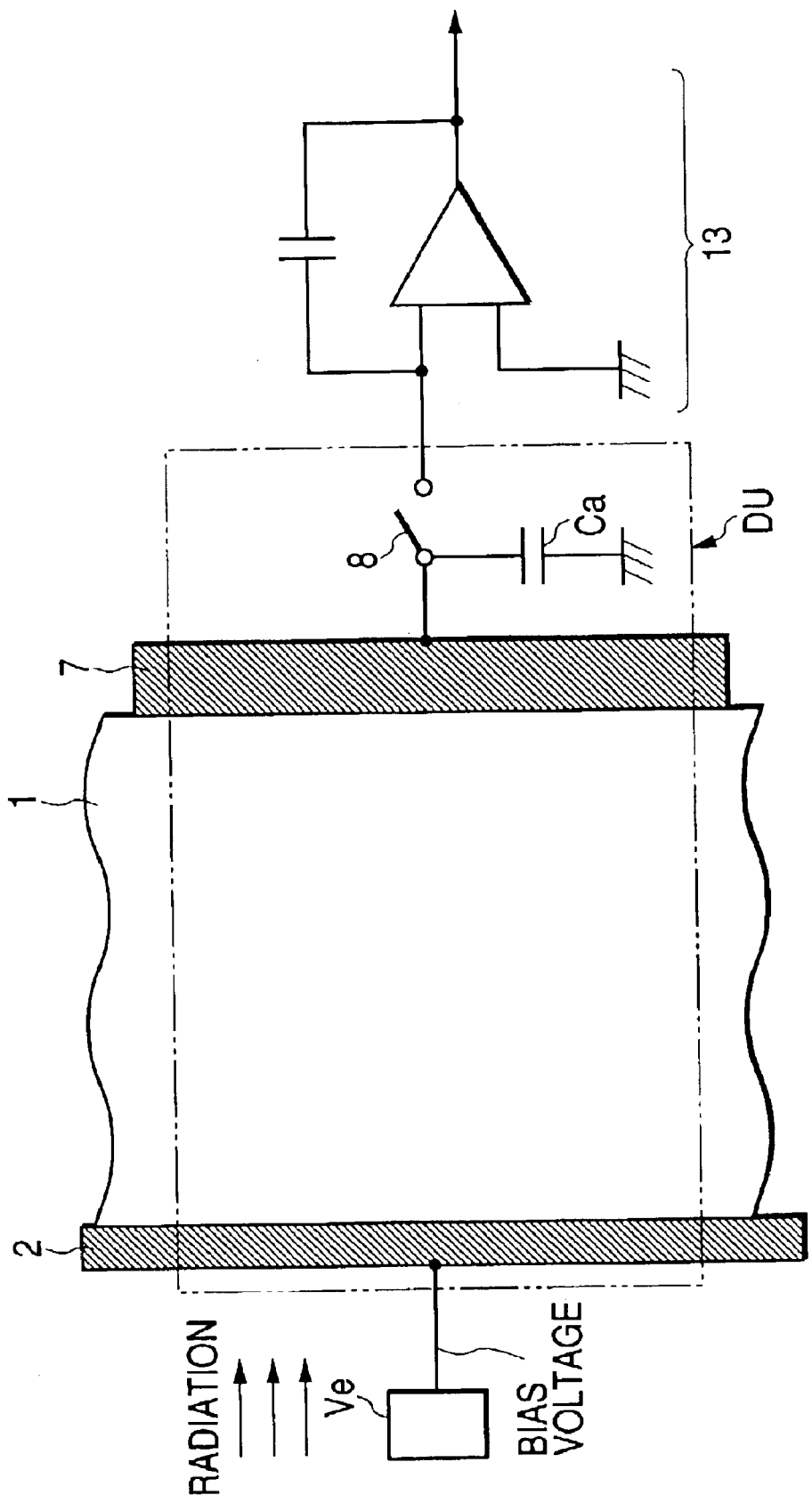
FIG. 7 is an explanatory view showing a situation of detecting operation of a radiation detection unit according to the embodiment of the invention.

An explanation will be given of embodiments of the invention in reference to the drawings. FIG. 1 is an outline sectional view showing a constitution of a first embodiment of a radiation sensor portion of a radiation detector according to the invention. FIG. 2 is an outline sectional view showing a second embodiment of a radiation detector according to the invention. FIG. 3 is an outline sectional view showing a third embodiment of a radiation detector of the embodiment. FIG. 4 is a plane view of the radiation sensor portion of the radiation detector according to the embodiment of FIG. 1. FIG. 5 is a block diagram showing a total constitution of the radiation detector according to the embodiment of FIG. 1. FIG. 6 is a view for explaining a method of forming an insulating substance having high withstand voltage property. FIG. 7 is a view for explaining detecting operation of a radiation detection unit of the radiation detector according to the embodiment.

As shown in FIG. 1, a radiation detector of the first embodiment includes an insulating substrate 6 of a glass substrate or the like, an amorphous semiconductor thick film 1, and a voltage application electrode 2, which serve as a radiation sensor portion. The insulating substrate 6 is formed with a capacitor Ca comprising $SiO_2$ layer or the like and a switching element 8, for example, a transistor (TFT), which is brought into a normally OFF (cut) state, for outputting charge stored at the capacitor Ca. The amorphous semiconductor thick film 1 is electrically connected to the charge storage capacitor Ca and formed above the insulating substrate 6 via a carrier collection electrode 7. In the amorphous semiconductor thick film 1, charge transfer media (carriers) are generated by incidence of radiation. The voltage application electrode 2 is provided at a surface of the amorphous semiconductor thick film 1 which is a radiation incident side.

The radiation detector of the first embodiment further includes a bias voltage supplying portion (power source) Ve for applying bias voltage to the voltage application electrode 2. The radiation detector is constructed by a constitution in which when radiation is irradiated in a state in which the bias voltage is applied to the voltage application electrode 2, carriers generated in accordance therewith are transmitted from the carrier collection electrode 7 to the capacitor Ca and stored there. Then, at a read timing, an ON signal is transmitted from a gate line 11 to thereby make the switching element 8 ON (connect) so that stored charge is read from a read line 10 as a radiation detection signal. A specific explanation will be given of constitutions of respective portions as follows.

In the case of the radiation detector of the first embodiment, the amorphous semiconductor thick film 1 is a high purity amorphous selenium (a-Se) thick film having a resistivity equal to or larger than $10^9 \Omega cm$ (preferably, equal to or larger than $10^{11} \Omega cm$) and a film thickness of around 0.5 mm through around 1.5 mm. The a-Se thick film is particularly excellent in being suitable for large area formation of a detecting area. When the amorphous semiconductor thick film 1 is thin, radiation passes therethrough and radiation cannot be absorbed sufficiently. Therefore, there is used a slightly thick film of around 0.5 mm through around 1.5 mm.

The voltage application electrode 2 and the carrier collection electrode 7 are formed by a pertinent metal of Au, Pt, Al, Ni, In or the like or ITO or the like. Naturally, the materials of the amorphous semiconductor thick film and the material of the electrode are not limited to those exemplified above.

Further, according to the radiation detector of the first embodiment, as a characteristic constitution, as shown in FIG. 1, silicone resin which is an insulating substance 3 with a high withstand voltage property is formed with a thickness of about 1 mm between the amorphous semiconductor thick film 1 and an end edge portion 2A of the voltage application electrode 2. The larger a width 3A of the insulating substance 3 with the high withstand voltage property, the better. Further, a size LA of the voltage application electrode 2 needs to be smaller than a size LB of a carrier collection electrode area including an outer peripheral dummy electrode 5 to avoid concentration of an electric field on the carrier collection electrode 7. Conversely, when LA is larger than LB, an electric field is concentrated on the outer peripheral dummy electrode 5. The outer peripheral dummy electrode 5 is an electrode installed right below the end edge portion 2A of the voltage application electrode 2 and is connected to a ground line 12. Further, even in a case in which the outer peripheral dummy electrode 5 is not separately provided but the carrier collection electrode 7 is provided right below the end edge portion 2A of the voltage application electrode 2, the case is allowable.

Further, according to a second embodiment shown in FIG. 2, an Sb2S3 film which is a high resistance film 4 which is provided with the solvent resistance property and the carrier selective property, is formed by a thickness of about 1 μm at least between the amorphous semiconductor thick film 1 and the insulating substance 3 with the high withstand voltage property. Although the Sb2S3 film is pointed out as an example of the high resistance film 4 which is provided with the solvent resistance property and the carrier selective property, other than Sb2S3, an inorganic semiconductor film of CdS, AsSe, SeTe, CdTe or the like and an organic film material of polycarbonate or the like added with a carrier transfer material, can be used. Although film thicknesses of these differ by selectivity of carrier, solvent resistance property, or adherence to the amorphous semiconductor thick film 1, the film thicknesses can be selected in a range of 0.05 μm through 10 μm. Further, although as the carrier selective high resistance film, generally, a selective film of n type (hole implantation preventing type) when used in positive bias and a selective film of p type (electron implantation preventing type) is used when used in negative bias, the high resistance film is not limited thereto depending on use thereof.

Further, according to a third embodiment shown in FIG. 3, the silicone resin which is the insulating substance 3 with the high withstand voltage property, is provided with a gradient in a thickness thereof. The thickness is 1 mm at the thickest portion on an outer side, and the insulating substance 3 is formed to be infinitely thin on an inner side thereof so that an apex of the gradient is formed at a front end portion thereof. This state corresponds to a case of a smallest angle in a graph showing a result of the electric filed calculating simulation of FIG. 10 and concentration of an electric field on the end edge portion 2A of the voltage application electrode 2 is further reduced. Further, although according to the above-described third embodiment, the constitution of forming the apex at the front end portion is shown, it seems that an excellent result is obtained even in a case of not forming the apex.

Although in the first embodiment of FIG. 1, the second embodiment of FIG. 2 and the third embodiment of FIG. 3 described above, silicone resin is used as an example of the insulating substance 3 with the high withstand voltage property, so far as the insulating substance 3 is constituted by a material having small reactivity between a solvent component in the resin and the amorphous semiconductor thick film 1, epoxy resin, acrylic resin, fluororesin or the like can be used. However, when a-Se is used for the amorphous semiconductor thick film 1, since a-Se is liable to be denatured by heat, it is necessary to select a resin of a type cured at normal temperature. Naturally, a thickness of forming the insulating substance is determined by necessary bias voltage and the higher the bias voltage, the thicker the thickness.

Further, in the radiation sensor portion of the detector of the first embodiment, as shown in FIG. 1, FIG. 4 and FIG. 5, there is constituted a flat panel type radiation sensor (plane sensor of a two-dimensional array constitution. That is, a number of the carrier collection electrodes 7 are formed in a shape of a two-dimensional matrix, one of the charge storage capacitors Ca and one of the charge reading switching elements 8 are provided to each of the carrier collection electrodes 7, and a number of detecting elements DU which are radiation detection units, are aligned along X and Y directions (for example 1024×1024). Further, FIG. 4 is a plane view of the radiation sensor portion of FIG. 1 and FIG. 5 is a view schematically showing an inner constitution thereof.

That is, in FIG. 5, there is constructed a constitution in which the voltage application electrode 2 is formed on an entire face as a common electrode of all of the detecting elements DU, the carrier collection electrodes 7 are separately formed as individual electrodes for respectives of the detecting elements DU in a shape of a two-dimensional matrix, one of the charge storage capacitors Ca and one of the charge reading switching elements 8 are connected to each of the carrier collection electrodes 7. Therefore, radiation can be detected locally by the respective radiation detection unit, and as a result, a two dimensional distribution of radiation intensity can be measured.

Further, according to the radiation sensor portion of the first embodiment of FIG. 1, as shown in FIG. 5, a gate of a thin film transistor for the switching element 8 of the detecting element DU is connected to the gate line 11 in the horizontal (X) direction, and a source thereof is connected to the read line 10 in the vertical (Y) direction. The read lines (10) are connected to a multiplexor 15 via a group of charge-voltage converters (preamplifier group) 13 and the gate lines 11 are connected to a gate driver 14. Further, according to the embodiment of FIG. 1, one of the charge-voltage converters 13 is connected to one of the read lines 10.

Further, in the case of the radiation sensor portion of the radiation detector according to the first embodiment of FIG. 1, a scanning signal for outputting a signal is transmitted to the multiplexor 15 and the gate driver 14. The detecting element DU of the radiation sensor portion is specified based on an address allocated in turn to the respective detecting elements DU along alignments in X direction and Y direction (for example, 0 through 1023). Therefore, the scanning signal for outputting the signal becomes a signal of designating respectively an X-direction address or a Y-direction address.

In accordance with applying outputting voltage from the gate driver 14 to the gate line 11 in X direction following the scanning signal in Y direction, the respective detecting elements DU are selected by a unit of row. Further, by switching the multiplexor 15 by following the scanning signal in X direction, charge stored to the capacitors Ca of the detecting elements DU of the selected row is transmitted to outside successively via the group of charge-voltage converters 13 . . . 13 and the multiplexor 15.

When the radiation detector of the first embodiment of FIG. 1 is used as, for example, an X-ray detector of an X-ray fluoroscopic imaging apparatus, detected signals of the respective detecting elements DU are successively outputted from the multiplexor 15 as pixel signals, thereafter subjected to necessary signal processings of noise processing and the like at an image processing portion DT and displayed as a two-dimensional image (X-ray fluoroscopic image) at an image display portion MT.

It can be regarded from the above-described that the system of outputting the detected signal at the radiation sensor portion of the first embodiment of FIG. 1, is constructed by a constitution substantially similar to that of an image apparatus of a normal TV camera or the like. In the case of the first embodiment of FIG. 1, there is constructed a further integrated constitution in which the radiation sensor portion is installed with the charge-voltage converter group 13, the multiplexor 15, the gate driver 14 and AD converters (not illustrated) as necessary. However, there may be constructed a constitution in which a total or a portion of the charge-voltage converter group 13, the multiplexor 15, the gate driver 14 and AD converters are separately installed.

Although described above, an explanation has been given of the case of constructing the first embodiment of FIG. 1 by the two-dimensional constitution as shown in FIG. 4 and FIG. 5, naturally, the second and third embodiments of FIG. 2 and FIG. 3 can similarly be formed as two-dimensional constitutions.

Next, an explanation will be given of a method of forming the radiation sensor portion by taking an example of the case of the third embodiment shown in FIG. 3. First, the thin film transistor for the switching element 8, the capacitor Ca and the carrier collection electrode 7 are formed on the surface of the insulating substrate 6 by utilizing a thin film forming technique by a vacuum film forming process and a patterning technique by a photolithography process. Next, the amorphous semiconductor thick film 1, the carrier selective high resistance film 4, the high withstand voltage insulating substance 3 and the voltage application electrode 2 are laminated successively on the insulating substrate 6, so that the radiation sensor portion is finished.

Here, as the high withstand voltage insulating substance 3, silicone resin can be used. In such a case, there is used a material in which the viscosity of the high withstand voltage insulating silicone resin is adjusted by using a solvent of alcohol species, and various kinds thereof on sale can be used. The insulating substance 3 is formed in such a manner that the material is coated by moving a nozzle above a predetermined area in correspondence with the end edge portion 2A of the voltage application electrode 2 on the insulating substrate 6 formed with the amorphous semiconductor thick film 1 and the high resistance film 4 while injecting the material from a tip of the nozzle by using compressed air or the like; and thereafter, the material is fixedly attached thereto by removing the solvent of the alcohol species by drying. In such a case, the thickness of the high withstand pressure insulating substance 3 can be adjusted by a sectional shape of the nozzle, a distance between the nozzle and the amorphous semiconductor thick film 1, pressure of compressed air, moving speed or the like. The movement can be carried out by moving the board side instead of the nozzle side.

Further, by using a nozzle a front end of which is cut skewedly as shown in FIG. 6, there can easily be realized a mode in which the high withstand voltage insulating substance 3 has a thickness with a gradient so that the inner side is infinitely thinned, as shown in the third embodiment shown in FIG. 3.

Next, an explanation will be given of operation of detecting radiation by the radiation detector of the first through third embodiments shown in FIG. 1 through FIG. 3 in reference to FIG. 7. When the radiation is detected by the radiation detector of the embodiments, as shown in FIG. 7, radiation constituting an object of detection is made incident on the voltage application electrode 2 on the surface side of the amorphous semiconductor thick film 1 in the state of applying bias voltage. Electrons and holes which are charging moving media (carriers) generated by incidence of radiation, are moved to the voltage application electrode 2 and the carrier collection electrode 7 by the bias voltage, and charge is stored to the charge storage capacitor Ca on the side of the carrier collection electrode 7 in correspondence with a generated number thereof. In accordance with shift of the charge reading switching element 8 to the ON state, stored charge is read as a radiation detection signal via the switch 8 and thereafter converted into a voltage signal by the charge-voltage converter 13.

Further, in the case of the first through third embodiments of the radiation detector of FIG. 1 through FIG. 3, since the high withstand voltage insulating substance 3 is formed between the amorphous semiconductor thick film 1 and the end edge portion 2A of the voltage application electrode 2, concentration of an electric field on the end edge portion 2A of the voltage application electrode is eliminated and a prestage phenomenon of penetration discharge or discharge breakdown is not caused.

Further, the structure in which the high withstand voltage insulating substance 3 is formed between the amorphous semiconductor thick film 1 and the end edge portion 2A of the voltage application electrode 2, functions also as a protective film of the end edge portion of the amorphous semiconductor thick film 1 which is comparatively inferior in environment resistance.

Further, according to the second and third embodiments of FIG. 2 and FIG. 3, there is formed the high resistance film 4 which is provided with the solvent resistance property and the carrier selective property, at least between the high withstand voltage insulating substance 3 and the amorphous semiconductor thick film 1. Therefore, there is not caused a phenomenon in which the surface of the amorphous semiconductor thick film 1 is denatured by a solvent component of the high withstand voltage insulating substance 3, creeping discharge is caused and withstand voltage is lowered.

Next, in order to verify that the detector of the embodiment achieves an effect of preventing penetration discharge at the end edge portion of the electrode, an electric field is calculated. FIG. 10 shows a result thereof and FIG. 8, FIG. 9 and FIG. 12 show calculation models.

Figure 8:
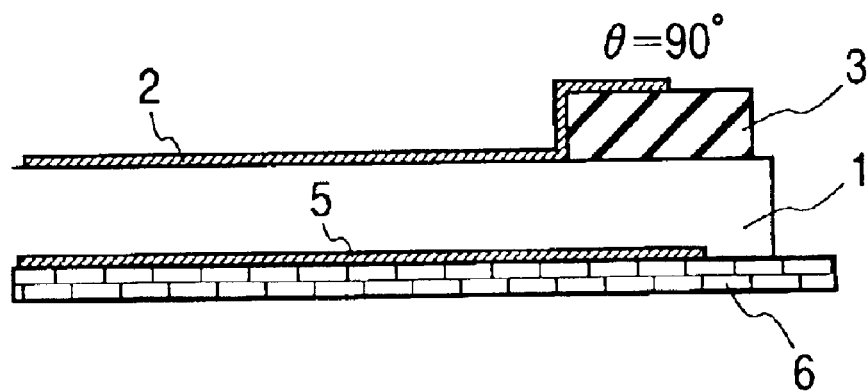
FIG. 8 is a view showing a portion of the high withstand voltage insulating substance of the radiation detection unit according to the embodiment of the invention.

FIG. 8 shows a case in correspondence with the first embodiment of FIG. 1 and is a case of raising the electrode end by inserting the high withstand voltage insulating substance to the end portion of the electrode. A width of a portion raised by the insulating substance at the end portion of the electrode is 10 mm, a thickness of the inserted insulating substance is 1 mm and the relative dielectric constant is 3.0.

Figure 9:
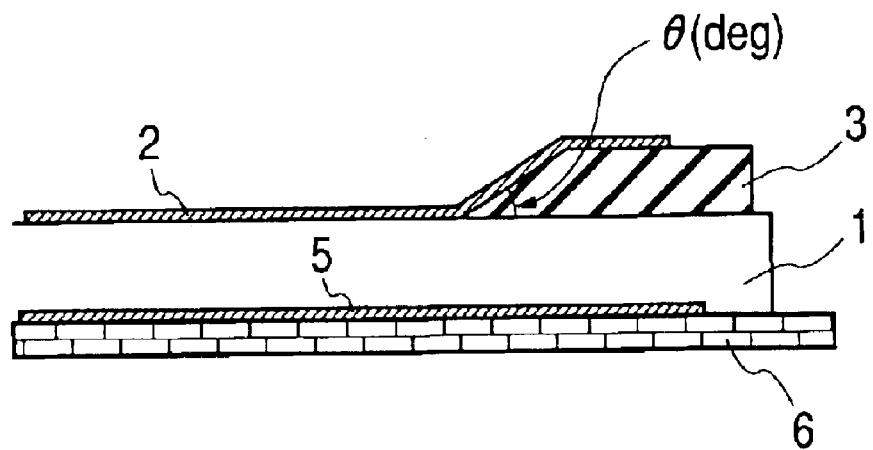
FIG. 9 is a view showing a portion of the high withstand voltage insulating substance of another radiation detection unit according to the embodiment of the invention.
Figure 10:
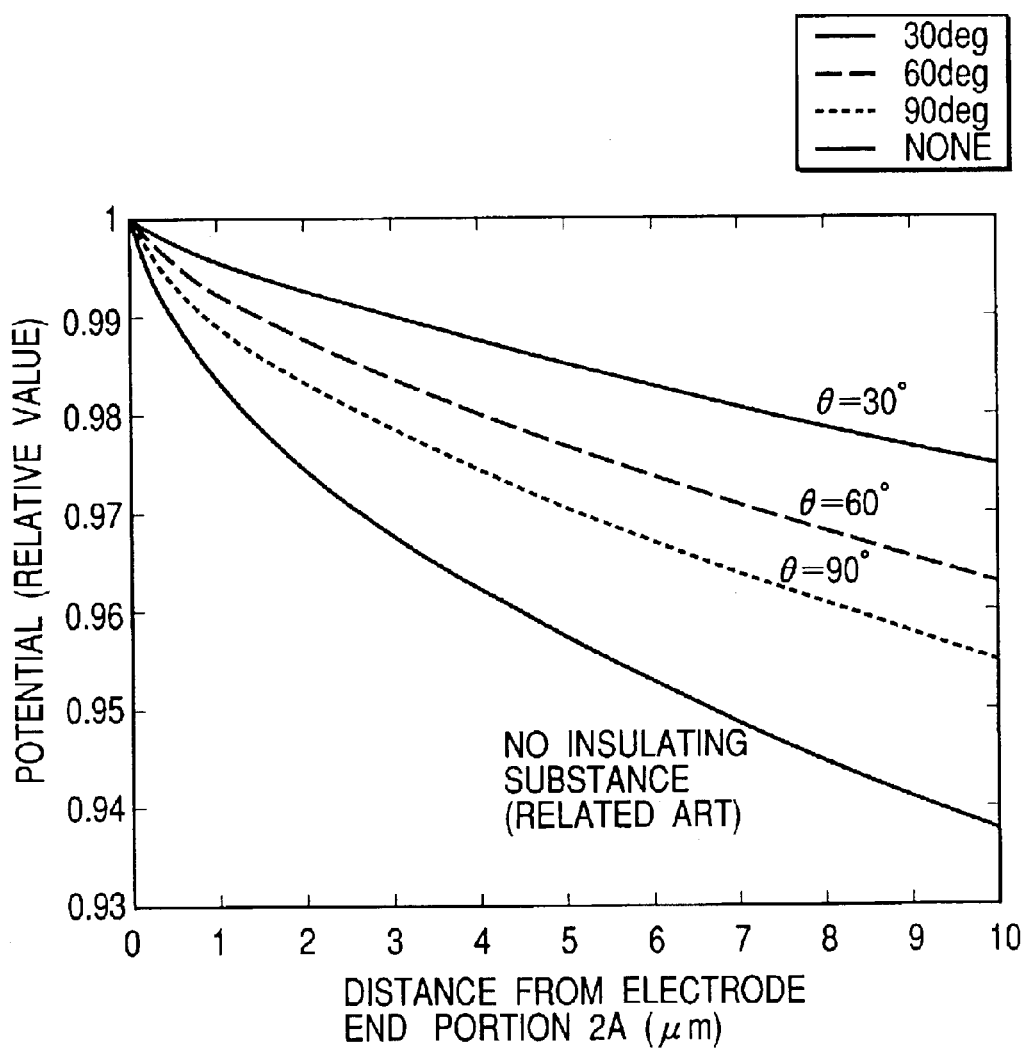
FIG. 10 is a graph showing a result of an electric filed calculating simulation of the radiation detector.
Figure 11:
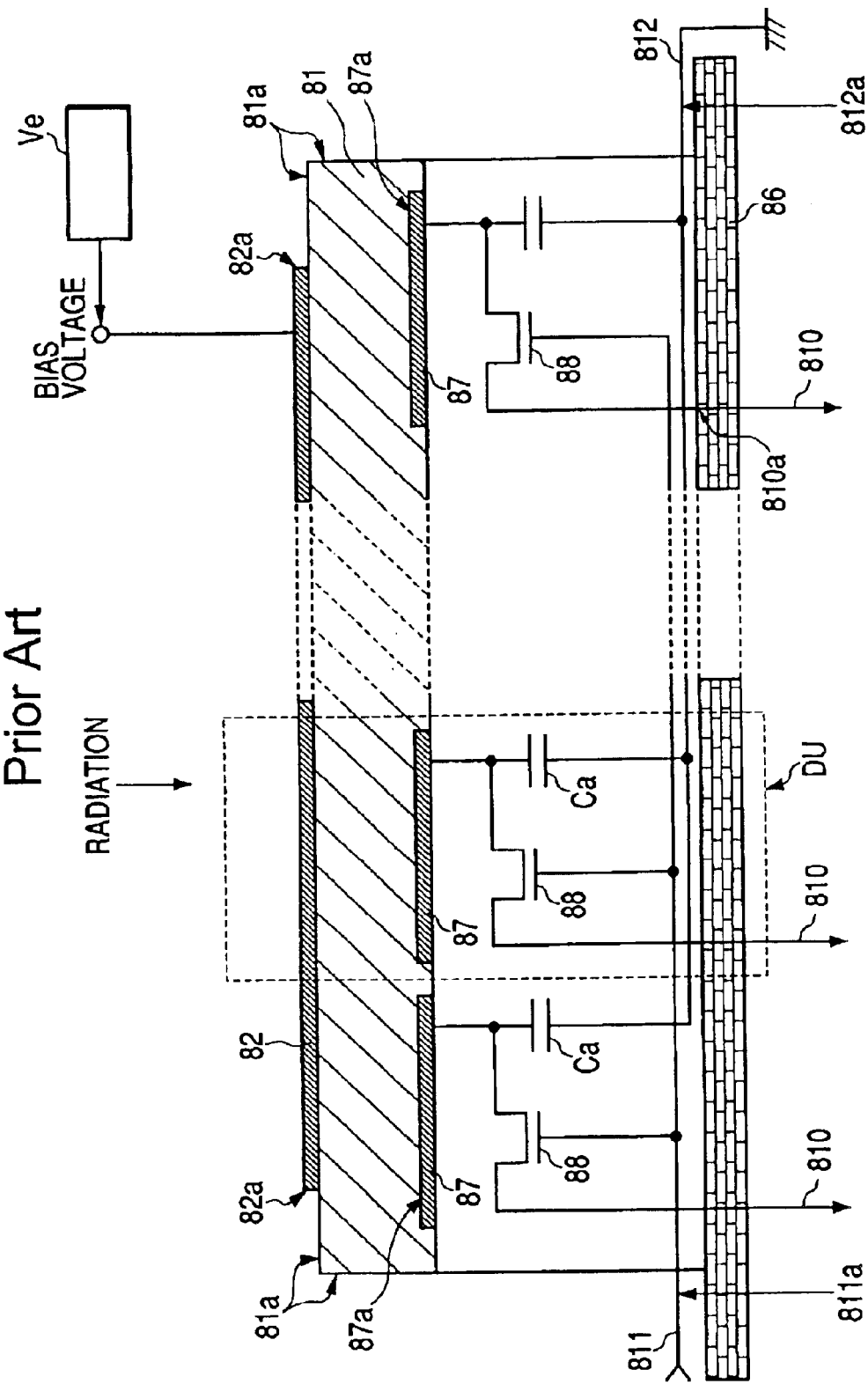
FIG. 11 is an outline sectional view showing a constitution of an essential portion of a related art radiation detector.

FIG. 9 shows a case in correspondence with the third embodiment and is a case in which a gradient is given to the thickness of the insulating substance to thereby thin the inner side and thicken the outer side. The angle of the front end of the insulating substance is constituted by two kinds of 30 and 60 degrees.

Figure 12:
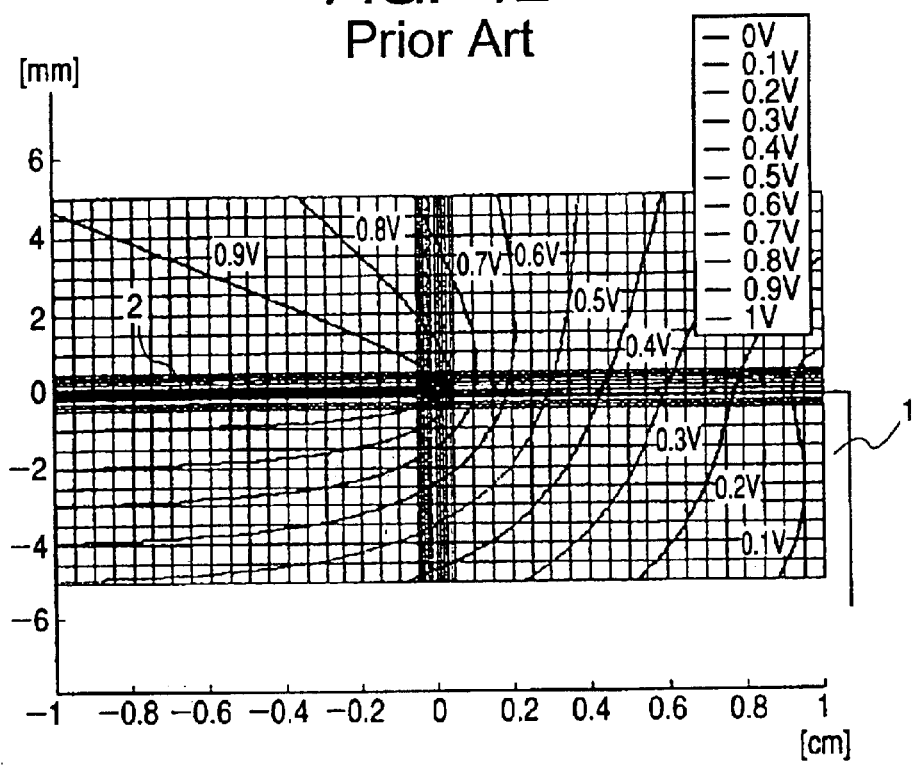
FIG. 12 is a diagram showing a state of concentration of charge in the related art radiation detector.
Figure 13A:
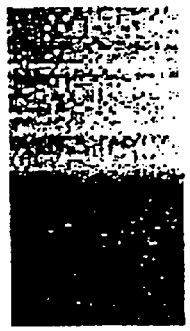
FIGS. 13A and 13B show experimental examples showing a state of causing discharge in the related art radiation detector.
Figure 13B:

In contrast thereto, FIG. 12 shows a case of the related art example in which the insulating substance is not inserted as described above. With regard to the respective cases, the potential distribution at the vicinity of the end portion of the electrode (down to 10 $\mu$m from the surface of the electrode) is calculated and the electric field intensity at the vicinity of the end portion of the upper electrode is predicted. Further, in FIG. 12, also the potential distribution in the case of applying voltage is overwritten to display for reference and as already described, it is known that the potential change is large and the electric field is concentrated on the vicinity of the end portion of the electrode.

FIG. 10 shows a result of the electric field calculating simulation in the respective cases of FIG. 8, FIG. 9 and FIG. 12. FIG. 10 shows the potential change in a range of from 0 to 10 $\mu$m in the abscissa direction of FIG. 12. Further, in FIG. 10, the abscissa of "distance from electrode end portion 2A" designates a distance from a position in correspondence with the electrode end portion 2A on the face of the amorphous semiconductor thick film 1 (surface of amorphous semiconductor thick film) in a depth direction (lower direction in drawings) As is apparent from the drawing, it is known that the sharper the front end angle of the insulating material (the smaller the θ), the smaller the potential drop in the depth direction and the smaller the concentration of the electric field.

Although the invention is as described above, the invention is not limited only to the above-described embodiments but, for example, embodiments shown below can also be adopted.

(1) Although in the case of the above-described embodiment, the amorphous semiconductor thick film 1 is the high purity a-Se thick film, the amorphous semiconductor thick film 1 according to the invention may be an a-Se thick film doped with As or Te having crystallization preventing operation, or an amorphous semiconductor thick film of an Se species compound. Further, in place of the amorphous semiconductor thick film, a radiation sensitive film of cadtel (CdTe) or the like may be used.

(2) Further, although according to the above-described embodiment, a middle layer is not provided between the carrier collection electrode 7 and the amorphous semiconductor thick film 1, a carrier selective middle layer of an Sb2S3 film, an Se species compound film or the like may be provided.

(3) Further, although according to the above-described embodiment, there is constructed the two-dimensional array constitution in which a number of the detecting elements DU are aligned in the vertical direction and in the horizontal direction, there is pointed out, as a modified example, an detector having a constitution of a line sensor in which a plurality of the detecting elements DU are aligned by only a single row or column in the vertical or the horizontal direction, or an detector having a constitution of only a single detecting element DU.

(4) Further, also radiation constituting an object of detection in the radiation detector of the invention, is not limited to X-ray but all radiation.

According to the radiation detector of the present invention, the high withstand voltage insulating substance is formed between the radiation sensitive type semiconductor thick film suitable for forming a large area and the end edge portion of the voltage application electrode. Therefore, concentration of an electric field on the end edge portion of the voltage application electrode is eliminated, a prestage phenomenon of penetration discharge or discharge breakdown is not caused and stable detecting operation is continued for a long period of time.

Further, the structure of forming the high withstand voltage insulating substance at the end edge portion of the voltage application electrode, functions also as a protective film of the semiconductor thick film comparatively inferior in environment resistance. Therefore, reliability can be ensured for a long period of time.

Furthermore, according to the radiation detector of the present invention, the high resistance film, which is provided with the solvent resistance property and the carrier selective property, is formed at least between the semiconductor thick film and the high withstand insulating substance. Therefore, there is achieved an effect of not only preventing the surface of the semiconductor thick film from being denatured by a solvent component of a thermosetting synthetic resin having high withstand voltage property, but also preventing dark current from being increased. There can be achieved a highly sensitive detection characteristic in which an increase in dark current is inconsiderable even when high bias voltage is applied.

Further, according to the radiation detector of the present invention, there is constructed the two-dimensional array constitution in which the charge storage capacitors and the charge reading switching elements are respectively provided for respectives of the carrier collection electrodes formed by a number of pieces thereof in the shape of the two dimensional matrix and the radiation detection units are aligned in a shape of a matrix. Therefore, radiation can be detected locally at the respective radiation detection unit and a two-dimensional distribution of an intensity of radiation can be measured with high accuracy by applying high bias voltage.

Furthermore, according to the radiation detector of the present invention, the high withstand voltage insulating substance has the thickness with the gradient so that the insulating substance is formed to be infinitely thinned on the inner side and thickened on the outer side. Therefore, concentration of the electric field on the end edge portion of the voltage application electrode is further reduced and reliability can be achieved for a long period of time.

What is claimed is:

1. A radiation detector comprising:

an insulating substrate formed with a capacitor for storing charge and a switching element for reading the charge;

a carrier collection electrode formed on the insulating substrate and electrically connected to the charge storage capacitor;

a radiation sensitive type semiconductor thick film formed on the carrier collection electrode for generating charge transfer media by incidence of a radiation;

a voltage application electrode formed on a surface of the semiconductor thick film; and an insulating substance with a high withstand voltage property formed between the semiconductor thick film and an end edge portion of the voltage application electrode, wherein the charge is generated at the semiconductor thick film by irradiating the radiation, stored at the charge storage capacitor and read as a radiation detection signal via the switching element.

2. The radiation detector according to claim 1, further comprising:

a high resistance film with a solvent resistance property and a carrier selective property formed at least between the semiconductor thick film and the high withstand voltage insulating substance.

3. The radiation detector according to claim 1, wherein a plurality of the carrier collection electrodes are formed in a shape of a two-dimensional matrix, and one of the charge storage capacitors and one of the charge reading switching elements are provided at each of the carrier collection electrodes to thereby constitute a two-dimensional array.

4. The radiation detector according to claim 1, wherein the high withstand voltage insulating substance has a thickness with a gradient to be increased toward the end edge portion of the voltage application electrode.

5. The radiation detector according to claim 1, wherein the semiconductor thick film is an amorphous semiconductor thick film.

* * * * *